(12) United States Patent
Feeney et al.

(10) Patent No.: US 7,998,335 B2
(45) Date of Patent: Aug. 16, 2011

(54) CONTROLLED ELECTROCHEMICAL POLISHING METHOD

(75) Inventors: Paul M. Feeney, Aurora, IL (US); Vlasta Brusic, Geneva, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 1205 days.

(21) Appl. No.: 11/150,944

(22) Filed: Jun. 13, 2005

(65) Prior Publication Data
US 2006/0281196 A1    Dec. 14, 2006

(51) Int. Cl.
*C25F 3/18* (2006.01)
(52) U.S. Cl. ........................ 205/674; 205/640
(58) Field of Classification Search .................. 205/640, 205/674
See application file for complete search history.

(56) References Cited

U.S. PATENT DOCUMENTS

| | | | |
|---|---|---|---|
| 4,111,767 A | 9/1978 | Kawagishi et al. | |
| 4,404,074 A | 9/1983 | Tomaszewski | |
| 6,140,234 A | 10/2000 | Uzoh et al. | |
| 6,299,741 B1 | 10/2001 | Sun et al. | |
| 6,379,223 B1 | 4/2002 | Sun et al. | |
| 6,402,592 B1 | 6/2002 | Zhu et al. | |
| 6,492,266 B1 | 12/2002 | Ngo et al. | |
| 6,579,439 B1 * | 6/2003 | Chandler | 205/671 |
| 6,592,742 B2 | 7/2003 | Sun et al. | |
| 6,726,815 B1 * | 4/2004 | Artmann et al. | 204/267 |
| 6,739,951 B2 | 5/2004 | Sun et al. | |
| 6,750,144 B2 | 6/2004 | Taylor | |
| 6,811,680 B2 | 11/2004 | Chen et al. | |
| 6,861,354 B2 | 3/2005 | Uzoh et al. | |
| 6,863,797 B2 | 3/2005 | Sun et al. | |
| 6,867,136 B2 | 3/2005 | Basol et al. | |
| 6,878,259 B2 | 4/2005 | Taylor et al. | |
| 6,881,318 B2 | 4/2005 | Hey et al. | |
| 6,884,724 B2 | 4/2005 | Hsu et al. | |
| 6,899,804 B2 | 5/2005 | Duboust et al. | |
| 7,125,477 B2 * | 10/2006 | Butterfield et al. | 204/224 M |
| 2002/0033341 A1 | 3/2002 | Taylor et al. | |
| 2002/0119286 A1 | 8/2002 | Chen et al. | |
| 2002/0130049 A1 | 9/2002 | Chen et al. | |
| 2003/0010648 A1 | 1/2003 | Sun et al. | |
| 2003/0019755 A1 | 1/2003 | Hey et al. | |
| 2003/0038038 A1 | 2/2003 | Basol et al. | |
| 2003/0040188 A1 | 2/2003 | Hsu et al. | |
| 2003/0116445 A1 | 6/2003 | Sun et al. | |
| 2003/0116446 A1 | 6/2003 | Duboust et al. | |
| 2003/0119311 A1 | 6/2003 | Basol et al. | |
| 2003/0141201 A1 * | 7/2003 | Basol | 205/668 |
| 2003/0160326 A1 | 8/2003 | Uzoh et al. | |
| 2003/0166339 A1 | 9/2003 | Thomas et al. | |
| 2003/0178315 A1 | 9/2003 | Taylor | |
| 2004/0012090 A1 | 1/2004 | Basol et al. | |
| 2004/0154931 A1 * | 8/2004 | Hongo et al. | 205/676 |
| 2004/0248412 A1 * | 12/2004 | Liu et al. | 438/689 |

FOREIGN PATENT DOCUMENTS

| | | |
|---|---|---|
| DE | 675635 | 5/1939 |
| EP | 1 006 166 A | 6/2000 |
| JP | 04072100 | 3/1992 |
| JP | 04180600 | 6/1992 |
| JP | 2001-57367 A | 2/2001 |
| WO | WO 97/48839 | 12/1997 |
| WO | WO 02/41369 | 5/2002 |
| WO | WO 03/001581 A2 | 1/2003 |
| WO | WO 2005/068572 | 7/2005 |

* cited by examiner

Primary Examiner — Alexa D. Neckel
Assistant Examiner — Nicholas A. Smith
(74) Attorney, Agent, or Firm — Thomas E. Omholt; Caryn Borg-Breen; Frank J. Koszyk

(57) ABSTRACT

The invention relates to a method of polishing a substrate comprising at least one metal layer by applying an electrochemical potential between the substrate and at least one electrode in contact with a polishing composition comprising a reducing agent or an oxidizing agent.

28 Claims, No Drawings

CONTROLLED ELECTROCHEMICAL POLISHING METHOD

FIELD OF THE INVENTION

This invention pertains to a method of providing controlled electrochemical polishing of semiconductor substrates.

BACKGROUND OF THE INVENTION

Polishing processes are used in the manufacturing of microelectronic devices to form flat surfaces on semiconductor wafers, field emission displays, and other microelectronic substrates. For example, the manufacture of semiconductor devices generally involves the formation of various process layers, selective removal or patterning of portions of those layers, and deposition of yet additional process layers above the surface of a semiconducting substrate to form a semiconductor wafer. The process layers can include, by way of example, insulation layers, gate oxide layers, conductive layers, and layers of metal or glass, etc. It is generally desirable in certain steps of the wafer process that the uppermost surface of the process layers be planar, i.e., flat, for the deposition of subsequent layers. Polishing processes such as chemical-mechanical polishing ("CMP") are used to planarize process layers wherein a deposited material, such as a conductive or insulating material, is polished to planarize the wafer for subsequent process steps.

Due to its desirable electrical properties, copper is being increasingly utilized in integrated circuit fabrication. However, the use of copper presents its own special fabrication problems. For example, the controlled dry etching of copper for ultra large-scale integration (ULSI) applications is very costly and technically challenging, and new processes and techniques, such as damascene or dual damascene processes, are being used to form copper substrate features. In damascene processes, a feature is defined in a dielectric material and subsequently filled with the conductive material (e.g., copper).

In order to ensure that the different features of relatively small integrated circuits (e.g., less than 0.25 micron or less than 0.1 micron) are sufficiently insulated or isolated from one another (e.g., to eliminate coupling or "crosstalk" between features), dielectric materials with low dielectric constants (e.g., less than about 3) are being used in the manufacture of damascene structures. However, low k dielectric materials, such as carbon doped silicon oxides, may deform or fracture under conventional polishing pressures (e.g., about 40 kPa), called "downforce," which deformation or fracturing can detrimentally affect the substrate polish quality and device formation and/or function. For example, relative rotational movement between the substrate and a polishing pad under a typical CMP downforce can induce a shear force along the substrate surface and deform the low k material to form topographical defects, which can detrimentally affect subsequent polishing:

One solution for polishing conductive materials (e.g., copper) in low dielectric materials with reduced or minimal defects formed thereon is to polish the conductive material using electrochemical-mechanical polishing (ECMP) techniques. ECMP techniques remove conductive material from a substrate surface by electrochemical dissolution while concurrently polishing the substrate with reduced mechanical abrasion compared to conventional CMP processes. The electrochemical dissolution is performed by applying an electric potential or bias between a cathode and substrate surface to remove conductive materials from a substrate surface into a surrounding electrolyte or electrochemical-mechanical polishing composition.

While several suggested formulations for electrochemical-mechanical polishing compositions can be found within the art, few, if any, of these electrochemical-mechanical polishing compositions exhibit desirable polishing characteristics. For example, the suggested electrolytes or electrochemical-mechanical polishing compositions may exhibit polishing rates comparable with conventional CMP processes without the need for the application of an excessive downforce, but the electrolytes or electrochemical-mechanical polishing compositions can cause excessive dishing of the conductive material which can lead to erosion of the dielectric material. The topographical defects resulting from such dishing and erosion can further lead to non-uniform removal of additional materials from the substrate surface, such as barrier layer materials disposed beneath the conductive material and/or dielectric material, and produce a substrate surface having a less than desirable quality which can negatively impact the performance of the integrated circuit.

Accordingly, there remains a need for an electrochemical-mechanical polishing method that exhibits relatively high removal rates of substrate material at low downforce while minimizing dishing and erosion of the substrate. The invention provides such an electrochemical-mechanical polishing method. These and other advantages of the invention, as well as additional inventive features, will be apparent from the description of the invention provided herein.

BRIEF SUMMARY OF THE INVENTION

The invention provides a method of polishing a substrate comprising (i) providing a substrate comprising at least one metal layer, (ii) contacting the substrate with a polishing composition comprising a liquid carrier and an electrolyte, (iii) applying an electrochemical potential between the substrate and an electrode in contact with the polishing composition, wherein either (a) the applied potential is positive and the polishing composition further comprises a reducing agent for the metal or (b) the applied potential is negative and the polishing composition further comprises an oxidizing agent for the metal, and (iv) removing at least a portion of the metal layer from a surface of the substrate.

The invention also provides a method of polishing a substrate comprising (i) providing a substrate comprising at least one metal layer, wherein the substrate comprises a front surface and an opposing back surface, (ii) contacting the substrate with a polishing composition comprising a liquid carrier and an electrolyte, (iii) applying a positive electrochemical potential between the front surface of the substrate and a first electrode in contact with the polishing composition and applying a negative electrochemical potential between the back surface of the substrate and a second electrode in contact with the polishing composition, and (iv) removing at least a portion of the metal layer from the surface of the substrate.

The invention further provides a method of polishing a substrate comprising (i) providing a substrate comprising a copper layer and a tantalum layer, (ii) contacting the substrate with a first composition comprising a liquid carrier and an electrolyte, applying a positive electrochemical potential between the substrate and an electrode in contact with the first composition, and selectively removing at least a portion of the copper layer from a surface of the substrate, (iii) contacting the substrate with a second composition comprising a liquid carrier and an oxidizing agent for tantalum in the absence of an applied electrochemical potential, and selectively removing at least a portion of the tantalum layer from the surface of the substrate, and (iv) contacting the substrate with a third composition comprising a liquid carrier, an electrolyte, and copper ions, applying a negative electrochemical potential between the substrate and an electrode in contact with the third polishing composition, and selectively depositing copper onto the copper layer.

DETAILED DESCRIPTION OF THE INVENTION

The present invention is directed to a method of polishing a substrate using a combination of chemical and electrochemical processes. In particular, the method comprises (i) providing a substrate comprising at least one metal layer, (ii) contacting the substrate with a polishing composition comprising a liquid carrier and an electrolyte, (iii) applying an electrochemical potential between the substrate and an electrode in contact with the polishing composition, and (iv) removing at least a portion of the metal layer from a surface of the substrate.

The liquid carrier is used to facilitate the application of the electrolyte and any other additives to the surface of a suitable substrate to be polished or planarized. The liquid carrier can be any suitable liquid carrier. Typically, the liquid carrier is water, a mixture of water and a suitable water-miscible solvent, or an emulsion. Preferably, the liquid carrier comprises, consists essentially of, or consists of water, more preferably deionized water. The electrolyte can be any suitable electrolyte and can be present in the polishing composition in any suitable amount. Preferably, the electrolyte is selected from the group consisting of sulfates, nitrates, phosphates, and combinations thereof. More preferably, the electrolyte is a sulfate.

The substrate can be any suitable substrate comprising at least one metal layer. Suitable substrates include, but are not limited to, integrated circuits, memory or rigid disks, metals, interlayer dielectric (ILD) devices, semiconductors, microelectro-mechanical systems, ferroelectrics, and magnetic heads. The metal layer can comprise any suitable metal. The metal layer can be any suitable metal layer. Typically the metal layer is selected from the group consisting of aluminum, copper, gold, iridium, nickel, platinum, ruthenium, rhodium, silver, tantalum, titanium, tungsten, and combinations thereof. The substrate can further comprise at least one insulating layer. The insulating layer can be a metal oxide, porous metal oxide, glass, organic polymer, fluorinated organic polymer, or any other suitable high or low-κ insulating layer. In some embodiments, the substrate preferably comprises a copper layer and optionally a tantalum layer. More preferably the substrate comprises a copper layer and a tantalum layer. In other embodiments, the substrate preferably comprises gold.

In a first embodiment, the substrate is polished by a combination of chemical and electrochemical processes, where the particular chemical and electrochemical processes are selected to have opposing effects. In particular, an oxidizing electrochemical potential is combined with a chemical reducing agent or a chemical oxidizing agent is combined with a reducing electrochemical potential. The application of chemical and electrochemical processes having opposing effects in a method of polishing a substrate comprising a metal layer is expected to produce more controlled polishing or deposition of the metal layer and/or reduced defectivity.

Accordingly, when the potential applied to the substrate is positive, the polishing composition further comprises a chemical reducing agent, which supplies electrons to the substrate surface. The reducing agent can be any suitable reducing agent, particularly a reducing agent for the metal to be at least partially removed from the substrate. For example, the reducing agent can be selected from the group consisting of 3-hydroxy-4-pyrones (e.g., 3-hydroxy-2-methyl-4-pyrone), α-hydroxy-γ-butyrolactones, ascorbic acid, borane ($BH_3$), borohydrides, dialkylamine boranes (e.g., dimethylamine borane), formaldehyde, formic acid, hydrogen ($H_2$), hydroquinones (e.g., hydroquinone sulfonic acid), hydroxylamine, hypophosphorous acid ($H_3PO_2$), phosphorous acid ($H_3PO_3$), a metal or metal ions in an oxidation state having a standard redox potential that is less than the standard redox potential of the metal in an oxidized form, trihydroxybenzenes (e.g., 1,2,3-trihydroxybenzene, 1,2,4-trihydroxybenzene, or 1,3,5-trihydroxybenzene), solvated electrons (e.g., hydrated electrons), sulfurous acid ($H_2SO_3$), salts thereof, and mixtures thereof. The reducing metal or metal ions can be any suitable metal or metal ion having a standard redox potential that is less than the standard redox potential of the metal in an oxidized form. Suitable reducing metals or metal ions include, but are not limited to, alkaline earth metals, alkali metals, zinc, iron, $Fe^{2+}$ ions, and combinations thereof. Furthermore, it will be understood that the reducing metals or metal ions can be associated with a suitable complexing agent (e.g., a salt of ethylenediaminetetraacetic acid or propylenediaminetetraacetic acid). As utilized herein, the term "solvated electrons" refers to an electron surrounded by a small number of oriented solvent molecules (e.g., water molecules). Solvated electrons can be produced by a number of different processes, such as the radiolysis of water (e.g., using γ-rays) or the photolysis of an appropriate solute (e.g., $Fe(CN)_6^{4-}$ or $I^-$). Typically the reducing agent is selected from the group consisting of formaldehyde, formic acid, hypophosphite, hypophosphorous acid, phosphorus acid, sulfurous acid, ascorbic acids, organoboron compounds such as borane, borohydrides, dialkylamine boranes, hydrogen, salts thereof, and combinations thereof. Preferably, the reducing agent is selected from the group consisting of formaldehyde, organoboron compounds, salts thereof, and combinations thereof.

The polishing composition can comprise any suitable amount of the reducing agent. The amount of reducing agent desirably is small yet sufficient to retard the rate of oxidation of the metal layer and/or to reduce the number of defects on the surface of the substrate. While not wishing to be bound to any particular theory, it is believed that the addition of a small amount of reducing agent acts to reduce the number of oxides on the metal surface so as to increase the activity of the metal surface. Typically, the polishing composition comprises about 0.01 wt. % or more (e.g., about 0.05 wt. % or more, or about 0.1 wt. % or more) reducing agent, based on the weight of the liquid carrier and any components dissolved or suspended therein. The polishing composition also typically comprises about 15 wt. % or less (e.g., about 12 wt. % or less, about 10 wt. % or less, about 8 wt. % or less, or about 5 wt. % or less) reducing agent, based on the weight of the liquid carrier and any components dissolved or dispersed therein. In a preferred embodiment, the polishing composition comprises about 0.1 to about 5 wt. %, more preferably about 0.1 to about 1 wt. %, and most preferably about 0.1 to about 0.5 wt. % reducing agent, based on the weight of the liquid carrier and any components dissolved or suspended therein.

The positive potential applied to the substrate can be any suitable potential capable of oxidizing the metal layer of the substrate. Typically, the potential is just below the oxygen evolution potential, for example, about 900 mV greater than the open circuit potential (i.e., the equilibrium potential or the potential at which there is no current) of the metal layer of the substrate. Preferably, the potential is about 50 mV to about 800 mV greater than the open circuit potential of the metal layer of the substrate. More preferably, the potential is about 100 mV to about 700 mV greater than the open circuit potential of the metal layer of the substrate.

Alternatively, when the potential applied to the substrate is negative, the polishing composition further comprises an oxidizing agent. The oxidizing agent can be any suitable oxidizing agent, particularly an oxidizing agent for the metal to be at least partially removed from the substrate. Suitable oxidizing agents include inorganic and organic per-compounds, bromates, bromites, nitrates, chlorates, chlorites, hypochlorites, chromates, iodates, iron and copper salts (e.g., nitrates, sulfates, ethylenediaminetetraacetic acid (EDTA), and citrates), cerium salts, rare earth and transition metal oxides (e.g., osmium tetraoxide), potassium ferricyanide, potassium dichromate, iodic acid, and the like. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, Perchlorate salts, perboric acid, perborate salts, and permanganates. The oxidizing agent preferably is selected from the group consisting of bromates, bromites, chlorates, chlorites, hydrogen peroxide, hypochlorites, iodates, monoperoxy sulfate, monoperoxy sulfite, monoperoxyphosphate, monoperoxyhypophosphate, monoperoxypyrophosphate, organo-halo-oxy compounds, periodates, permanganate, peroxyacetic acid, and mixtures thereof. The oxidizing agent most preferably is hydrogen peroxide.

The polishing composition can comprise any suitable amount of the oxidizing agent. The amount of oxidizing agent present in the polishing composition desirably is sufficient to effectively remove at least a portion of the metal layer from a surface of the substrate. Typically, the polishing composition comprises about 0.01 wt. % or more (e.g., about 0.05 wt. % or more, or about 0.1 wt. % or more) oxidizing agent, based on the weight of the liquid carrier and any components dissolved or suspended therein. The polishing composition also typically comprises about 10 wt. % or less (e.g., about 8 wt. % or less, or about 6 wt. % or less) oxidizing agent, based on the weight of the liquid carrier and any components dissolved or suspended therein. In a preferred embodiment, the polishing composition comprises about 0.1 to about 10 wt. %, more preferably about 0.1 to about 8 wt. %, and most preferably about 0.1 to about 6 wt. % oxidizing agent, based on the weight of the liquid carrier and any components dissolved or suspended therein.

The negative potential applied to the substrate can be any suitable potential capable of regulating and/or counteracting the effect of the chemical oxidizing agent. The negative potential applied should be below the open circuit potential of the metal layer of the substrate. Typically, the applied potential is above the potential for hydrogen evolution, for example, in the range of from about 0 mV to about −800 mV. Desirably the potential is low enough to prevent metal dissolution. Preferably, the potential is in the range of from about −20 mV to about −300 mV. More preferably, the potential is in the range of from about −40 mV to about −200 mV. When the substrate comprises copper and tantalum, preferably the applied electrochemical potential is about 100 mV to about 300 mV less than the open circuit potential of the copper layer.

In a second embodiment, the substrate comprises a front surface and an opposing back surface. A positive electrochemical potential is applied between the front surface of the substrate and a first electrode in contact with the polishing composition, and a negative electrochemical potential is applied between the back surface of the substrate and a second electrode in contact with the polishing composition. The positive potential applied to the front surface of the substrate can be any suitable potential capable of oxidizing the metal layer of the substrate. Typically, the positive potential is about 900 mV greater than the open circuit oxidation potential of the metal layer of the substrate. Preferably, the positive potential is about 50 mV to about 800 mV. The negative potential applied to the back surface of the substrate can be any suitable potential capable of counteracting the effect of the oxidizing potential being applied to the front surface of the substrate. Typically, the negative potential is in the range of about 0 mV to about −800 mV. Preferably, the negative potential is in the range of about −20 mV to about −300 mV. The polishing composition used in conjunction with the second embodiment of the invention optionally further comprises any suitable oxidizing agent and/or a reducing agent as described above with respect to the first embodiment of the invention.

In a third embodiment, the substrate comprises copper and tantalum and is polished using a multi-step method. In one step of the multi-step method, the substrate is contacted with a first composition comprising a liquid carrier and an electrolyte while a positive electrochemical potential is applied between the substrate and an electrode in contact with the first composition so as to selectively remove at least a portion of the copper layer from a surface of the substrate. In a second step of the multi-step method, the substrate is contacted with a second composition comprising a liquid carrier and an oxidizing agent for the tantalum in the absence of an applied electrochemical potential so as to selectively remove at least a portion of the tantalum layer from the surface of the substrate. In a third step of the multi-step method, the substrate is contacted with a third composition comprising a liquid carrier, an electrolyte, and copper ions while a negative electrochemical potential is applied between the substrate and an electrode in contact with the third polishing composition so as to selectively deposit copper onto the copper layer. The steps described above with respect to the third embodiment of the invention can be carried out in any particular order. Typically the steps are carried out in the order recited above. In some cases it may be desirable to carry out the third step before the second step.

The first, second, and third compositions described above with respect to the third embodiment of the invention can be the same or different. For some applications, it is desirable for the first and second compositions to be the same. In particular, it may be desirable for the first and second compositions to have a copper to tantalum selectivity of about 10 or less. For other applications, it is desirable for the first and second compositions to be different. Typically, the third composition is different from the first and second compositions. The components of the compositions used in conjunction with the third embodiment of the invention are as described for those same components in the compositions of the other embodiments of the invention.

The polishing compositions of any of the embodiments described herein optionally further comprise an abrasive to assist in polishing the substrate. The abrasive can be any suitable abrasive and can be present in the polishing composition in any suitable amount. For example, the abrasive can be natural or synthetic, and can comprise certain hard polymers (e.g., polycarbonates), diamond (e.g., polycrystalline diamond), garnet, glass, carborundum, metal oxide, carbide, nitride, and the like. The abrasive desirably comprises a metal oxide. Suitable metal oxides include metal oxides selected from the group consisting of alumina, silica, ceria, zirconia, titania, germania, co-formed products thereof, and combinations thereof. Preferably, the metal oxide is selected from the group consisting of alumina, silica, ceria, and combinations thereof. Any suitable amount of abrasive can be present in the polishing composition. Typically about 0.01 wt. % or more (e.g., about 0.1 wt. % or more, or about 0.5 wt. % or more) abrasive will be present in the polishing composition based on the total weight of the polishing composition. The amount of abrasive in the polishing composition typically will not exceed about 30 wt. %, more typically will not exceed about 20 wt. % (e.g., will not exceed about 10 wt. %).

When an abrasive is present in the polishing composition, the polishing composition preferably is colloidally stable. The term colloid refers to the suspension of abrasive particles in the liquid carrier. Colloidal stability refers to the maintenance of that suspension through time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). The value of $[B]-[T]/[C]$ desirably is less than or equal to 0.3, and preferably is less than or equal to 0.1.

During conventional chemical-mechanical polishing processes, a complexing agent typically is used to enhance the removal rate of the substrate layer being removed. The electrochemical bias applied to the substrate and polishing composition in an electrochemical-mechanical polishing process can provide a removal rate comparable to or greater than that attained using a complexing agent in a conventional chemical-mechanical polishing process. As a result, the ability to effectively control the removal of the substrate layer (e.g., the removal rate and the uniformity of removal) possible in an electrochemical-mechanical polishing process becomes a priority. In these situations (i.e., in electrochemical-mechanical polishing processes), it has been found that a complexing agent can be used to improve the ability to control the removal rate attributable to the electrochemical bias applied to the substrate and polishing composition while also improving the uniformity of such removal. Accordingly, the polishing composition of any of the embodiments of the invention can optionally further comprise any suitable complexing agent. The complexing agent is any suitable chemical additive that binds with a metal (e.g., copper), particularly the metal to be at least partially removed from the substrate, in solution and can enhance the removal rate of the metal layer being removed from the substrate.

Suitable chelating or complexing agents include monofunctional organic acids, difunctional organic acids, trifunctional organic acids, multifunctional organic acids (e.g., citric acid), inorganic acids (e.g., phosphoric acid, pyrophosphoric acid, nitric acid), aromatic organic acids, polar organic acids (e.g., lactic acid, methyl lactic acid, tartaric acid, malic acid), unsaturated organic acids, amino acids, aromatic amino acids (e.g., anthranilic acid, picolinic acid, hydroxypicolinic acid), morpholino compounds, and zwitterions (e.g., betaine). More specifically, suitable chelating or complexing agents can include, for example, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and polycarboxylates (e.g., oxalates, phthalates, citrates, succinates, tartrates, malates, edetates (e.g., dipotassium EDTA), mixtures thereof, and the like), carboxylates containing one or more sulfonic and/or phosphonic groups, and the like. Suitable chelating or complexing agents also can include, for example, di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). The choice of suitable chelating or complexing agents will depend on the type of substrate layer (e.g., the type of metal) being polished. Preferably, the complexing agent is selected from the group consisting of monocarboxylic acids, di-carboxylic acids, tri-carboxylic acids, polycarboxylic acids, amino acids, and combinations thereof. More preferably, the complexing agent is selected from the group consisting of lactic acid, tartaric acid, citric acid, malonic acid, phthalic acid, succinic acid, glycolic acid, propionic acid, acetic acid, malic acid, oxalic acid, salicylic acid, picolinic acid, 2-hydroxybutyric acid, 3-hydroxybutyric acid, 2-methyl lactic acid, alanine, glycine, salts thereof, and combinations thereof. It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof.

The complexing agent can be present in the polishing composition in any suitable amount. Typically, the complexing agent is present in the polishing composition in an amount of about 0.01 wt. % or more, preferably about 0.05 wt. % or more, more preferably about 0.1 wt. % or more, and most preferably about 0.5 wt. % or more, based on the total weight of the polishing composition. The complexing agent typically is present in the polishing composition in an amount of about 10 wt. % or less, preferably about 5 wt. % or less, based on the total weight of the polishing composition.

In some embodiments it is desirable to include a polymeric complexing agent alone or in addition to one or more of the complexing agents described above. Suitable polymeric complexing agents include polycarboxylic acids (e.g., polyacrylic acid), polysulfonic acids, polyamines, and combinations thereof. The polymeric complexing agent can be present in the polishing composition in any suitable amount. Typically about 5 wt. % or less of the polymeric complexing agent is present in the polishing composition Optionally, the polishing composition of any of the embodiments of the invention further comprises a corrosion inhibitor (i.e., film-forming agent). The corrosion inhibitor can be any suitable corrosion inhibitor and can be present in the polishing composition in any suitable amount. Typically, the corrosion inhibitor is an organic compound containing a heteroatom-containing functional group. For example, the corrosion inhibitor is a heterocyclic organic compound with at least one 5- or 6-member heterocyclic ring as the active functional group, wherein the heterocyclic ring contains at least one nitrogen atom. Preferably, the corrosion inhibitor is selected from the group consisting of 1,2,3-triazole, 1,2,4-triazole, benzotriazole, benzimidazole, benzothiazole, and mixtures thereof. Most preferably, the composition comprises dual corrosion inhibitors of triazole and benzotriazole.

Optionally, the polishing composition of any of the embodiments further comprises a surfactant. The surfactant can be any suitable surfactant and can be present in the polishing composition in any suitable amount. Suitable surfactants can include, for example, cationic surfactants, anionic surfactants, nonionic surfactants, amphoteric surfactants, mixtures thereof, and the like. Preferably, the polishing composition comprises a nonionic surfactant. One example of a suitable nonionic surfactant is an ethylenediamine polyoxyethylene surfactant. The amount of surfactant typically is about 0.0001 wt. % to about 1 wt. % (preferably about 0.001 wt. % to about 0.1 wt. %, or about 0.005 wt. % to about 0.05 wt. %) based on the weight of the liquid carrier and any components dissolved or suspended therein.

The polishing composition of any of the embodiments can have any suitable pH. Typically, the polishing composition has a pH of about 13 or less. Preferably, the polishing composition has a pH of about 7 or less (e.g., about 6 or less, about 5 or less, or about 4 or less). Typically, the polishing composition has a pH of about 1 or more (e.g., about 2 or more).

The pH of the polishing composition can be achieved and/or maintained in any suitable manner. More specifically, the polishing composition can further comprise a pH adjustor, a pH buffering agent, or a combination thereof. The pH adjustor can be any suitable pH-adjusting compound. For example, the pH adjustor can be potassium hydroxide, sodium hydroxide, ammonium hydroxide, or a combination thereof. The pH buffering agent can be any suitable buffering agent, for example, phosphates, acetates, borates, ammonium salts, and the like. The polishing composition can comprise any suitable amount of a pH adjustor and/or a pH buffering agent, provided such amount is sufficient to achieve and/or maintain the pH of the polishing composition within the ranges set forth herein.

The polishing composition of any of the embodiments optionally further comprises an antifoaming agent. The antifoaming agent can be any suitable anti-foaming agent. Suitable antifoaming agents include, but are not limited to, silicon-based and acetylenic diol-based antifoaming agents. The amount of anti-foaming agent present in the polishing composition typically is about 40 ppm to about 140 ppm.

The polishing composition of any of the embodiments optionally further comprises a biocide. The biocide can be any suitable biocide, for example an isothiazolinone biocide. The amount of biocide used in the polishing composition typically is about 1 to about 50 ppm, preferably about 10 to about 20 ppm.

The positive (anodic) or negative (cathodic) potential can be applied to the substrate in any suitable manner. Typically, the apparatus which is used to carry out the electrochemical part of the method comprises at least two electrodes, one of which is submerged in the polishing composition and the other of which is coupled to the substrate, for example, either directly coupled to the substrate or through a conductive polishing pad and/or the platen of the polishing apparatus. In such an arrangement, the electrodes typically are connected to a power source and an electric potential or bias is applied to the electrodes so that a positive or negative potential is applied to the substrate. The power supply can be adapted to apply a constant current or constant potential to the electrodes and the substrate. In certain embodiments, a constant current can be applied to the electrodes and/or substrate for a first period of time, and then a constant potential can be applied to the electrodes and/or substrate for a second period of time. In such embodiments, the steps of applying a constant current and constant potential to the substrate can be performed in any suitable order. The electric potential applied to the electrodes and/or substrate can be constant or can be varied over time (i.e., a time-varying potential).

The method of polishing a substrate according to the invention can be carried out on any suitable apparatus. Suitable electrochemical-mechanical polishing apparatuses include, but are not limited to, the apparatuses disclosed in U.S. Pat. No. 6,379,223, U.S. Patent Application Publication Nos. 2002/0111121 A1, 2002/0119286 A1, 2002/0130049 A1, 2003/0010648 A1, 2003/0116445 A1, and 2003/0116446 A1, and International Patent Application WO 03/001581 A2.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a substrate consisting of:
   providing a substrate comprising at least one metal layer,
   (ii) contacting the substrate with a polishing composition comprising a liquid carrier and an electrolyte,
   (iii) applying an electrochemical potential between the substrate and an electrode in contact with the polishing composition, wherein either (a) the applied potential to the substrate is positive and the polishing composition further comprises a reducing agent for the metal or (b) the applied potential to the substrate is negative and the polishing composition further comprises an oxidizing agent for the metal, wherein the positive potential applied to the substrate is about 50 mV to about 800 mV greater than the open circuit potential of the metal layer of the substrate, and the negative potential applied to the substrate is about 100 mV to about 300 mV less than the open circuit potential of the metal layer of the substrate; and (iv) removing at least a portion of the metal layer from a surface of the substrate.

2. The method of claim 1, wherein the electrolyte is selected from the group consisting of sulfates, nitrates, phosphates, and combinations thereof.

3. The method of claim 1, wherein the applied potential is positive and the reducing agent is selected from the group consisting of formaldehyde, hypophosphorous acid, phosphorous acid, sulfurous acid, ascorbic acids, borane, borohydrides, dialkylamine boranes, hydrogen, salts thereof, and combinations thereof.

4. The method of claim 1, wherein the applied potential is negative and the oxidizing agent is selected from the group consisting of peroxides, persulfates, cerium salts, iron salts, and combinations thereof.

5. The method of claim 1, wherein the polishing composition further comprises an abrasive.

6. The method of claim 1, wherein the polishing composition further comprises a complexing agent.

7. The method of claim 6, wherein the complexing agent is an organic acid selected from the group consisting of monocarboxylic acids, dicarboxylic acids, polycarboxylic acids, amino acids, and combinations thereof.

8. The method of claim 6, wherein the complexing agent is selected from the group consisting of acetic acid, citric acid, lactic acid, malic acid, malonic acid, oxalic acid, polyacrylic acid, tartaric acid, alanine, glycine, and combinations thereof.

9. The method of claim 6, wherein the complexing agent is a polymeric complexing agent.

10. The method of claim 1, wherein the polishing composition has a pH of about 6 or less.

11. The method of claim 1, wherein the polishing composition further comprises a corrosion inhibitor.

12. The method of claim 1, wherein the polishing composition further comprises a surfactant.

13. The method of claim 1, wherein the substrate comprises a copper layer and optionally a tantalum layer.

14. The method of claim 1, wherein the substrate comprises a gold layer.

15. A method of polishing a substrate comprising:
providing a substrate comprising at least one metal layer, wherein the substrate comprises a front surface and an opposing back surface, (ii) contacting the substrate with a polishing composition comprising a liquid carrier and an electrolyte, (iii) applying a positive electrochemical potential between the front surface of the substrate and a first electrode in contact with the polishing composition and applying a negative electrochemical potential between the back surface of the substrate and a second electrode in contact with the polishing composition, and (iv) removing at least a portion of the metal layer from the surface of the substrate.

16. The method of claim 15, wherein the electrolyte is selected from the group consisting of sulfates, nitrates, phosphates, and combinations thereof.

17. The method of claim 15, wherein the polishing composition further comprises an abrasive.

18. The method of claim 15, wherein the polishing composition further comprises a complexing agent.

19. The method of claim 18, wherein the complexing agent is an organic acid selected from the group consisting of monocarboxylic acids, dicarboxylic acids, polycarboxylic acids, amino acids, and combinations thereof.

20. The method of claim 18, wherein the complexing agent is selected from the group consisting of acetic acid, citric acid, lactic acid, malic acid, malonic acid, oxalic acid, polyacrylic acid, tartaric acid, alanine, glycine, and combinations thereof.

21. The method of claim 18, wherein the complexing agent is a polymeric complexing agent.

22. The method of claim 15, wherein the polishing composition has a pH of about 6 or less.

23. The method of claim 15, wherein the polishing composition further comprises a corrosion inhibitor.

24. The method of claim 15, wherein the polishing composition further comprises a surfactant.

25. The method of claim 15, wherein the polishing composition further comprises an oxidizing agent for the metal.

26. The method of claim 15, wherein the polishing composition further comprises a reducing agent for the metal.

27. The method of claim 15, wherein the substrate comprises a copper layer and optionally a tantalum layer.

28. The method of claim 15, wherein the substrate comprises a gold layer.

* * * * *